United States Patent
Litmanen et al.

(10) Patent No.: US 7,693,494 B2
(45) Date of Patent: Apr. 6, 2010

(54) HIGH DYNAMIC RANGE PRE-POWER AMPLIFIER INCORPORATING DIGITAL ATTENUATOR

(75) Inventors: Petteri M. Litmanen, Richardson, TX (US); Heng-Chih Lin, Irvine, CA (US)

(73) Assignee: Texas Instruments Incorporated, Dallas, TX (US)

( * ) Notice: Subject to any disclaimer, the term of this patent is extended or adjusted under 35 U.S.C. 154(b) by 1064 days.

(21) Appl. No.: 11/296,148

(22) Filed: Dec. 6, 2005

(65) Prior Publication Data
US 2007/0129030 A1 Jun. 7, 2007

(51) Int. Cl.
*H04B 1/04* (2006.01)
*H01Q 11/12* (2006.01)

(52) U.S. Cl. .................. 455/91; 455/114.3; 455/127.1; 375/295; 375/297; 330/284

(58) Field of Classification Search .................. 455/91, 455/102, 107–113, 114.2–114.3, 118, 127.1–127.4; 375/295, 298, 300, 302–305; 330/278, 284, 330/305
See application file for complete search history.

(56) References Cited

U.S. PATENT DOCUMENTS

| | | | | |
|---|---|---|---|---|
| 5,834,975 | A * | 11/1998 | Bartlett et al. | 330/278 |
| 5,872,475 | A * | 2/1999 | Otaka | 327/308 |
| 6,049,252 | A * | 4/2000 | Iwata | 330/254 |
| 6,529,716 | B1 * | 3/2003 | Eidson et al. | 455/115.1 |
| 7,257,382 | B2 * | 8/2007 | Arai et al. | 455/91 |
| 7,502,422 | B2 * | 3/2009 | Dennis et al. | 375/295 |
| 7,586,376 | B2 * | 9/2009 | Litmanen | 330/305 |

* cited by examiner

*Primary Examiner*—Simon D Nguyen
(74) *Attorney, Agent, or Firm*—Lawrence J. Bassuk; W. James Brady; Frederick J. Telecky, Jr.

(57) ABSTRACT

A novel digital attenuator circuit and associated pre-power amplifier (PPA) that substantially increases the dynamic range of the amplifier. Increased dynamic range is achieved by placing a digital current attenuator circuit at the output of the pre-power amplifier so that the minimum possible current output of the transistor switch array of the PPA can be further attenuated. The attenuator functions to split the current between the load and the power supply $V_{DD}$ (i.e. AC ground) based on device ratio that is controlled digitally via an input power control word. The digital attenuator is constructed as a segmented digitally controlled matrix or cell array comprising at least a pass and bypass matrix or array. The pass matrix controls the amount of current output from the PPA while the bypass matrix controls the amount of current shorted to the AC ground (i.e. power supply). By varying the number of transistors on or off in each matrix, the power output of the PPA can be easily and accurately controlled.

4 Claims, 9 Drawing Sheets

HIGH DYNAMIC RANGE PRE-POWER AMPLIFIER INCORPORATING DIGITAL ATTENUATOR

FIELD OF THE INVENTION

The present invention relates to the field of data communications and more particularly relates to a high dynamic range pre-power amplifier incorporating a digital attenuator for use in the transmitter portion of a Digital RF Processor or Digital Radio Processor (DRP).

BACKGROUND OF THE INVENTION

It is well known in the communication arts that a transmit (Tx) buffer is required for both wired and wireless communications systems to interface the transmit path signal to the outside environment. In many cases, the transmit buffer is required to apply a variable gain to the transmit signal in order to increase or reduce the amplitude of the output signal. One such case occurs when the transmitted signal is part of an amplitude modulated communication system and the transmit buffer itself is used to implement the amplitude modulation function. The signal to noise ratio (SNR) requirements of such Tx buffers in most systems are extremely strict, meaning that any amplitude control circuitry should contribute no more than negligible noise to the buffer output. The reverse isolation (which can also be considered gain accuracy at low gain levels) of such transmit buffers is also an important concern. In addition, the current consumption requirements for these transmit buffers are limited such that any gain control scheme cannot 'burn' or waste current in order to meet the power consumption budget and the strict signal to noise requirements stated above.

A prior art digitally controlled near class E power amplifier designed for the Bluetooth wireless communication standard provides a limited number of bits for amplitude control (e.g., only 3.5 bits of amplitude control) and is used for power regulation of the transmitted constant envelope RF output. The previous lowest reported power consumption for a prior art GSM transmit chain, having no power control, is 17 mW with −7 dBm output power. The design for such a system has a transmitted power efficiency of 2.7% for an output power of 0 dBm.

There exist in the prior art multiple transmit chain architectures for transforming a digitally encoded bit stream into an RF modulated waveform at a power level suitable for transmission. The transmit power level for a cellular transceiver integrated circuit (IC) is typically around 3 dBm for interfacing with external power amplifiers (PAs). This output power level, however, is not constant in amplitude-modulated standards, such as EDGE, and must be controlled with appropriate variable-gain circuitry. Typical prior art architectures, such as single-sideband upconversion, perform digital-to-analog conversion on-chip and employ a variable gain pre-power amplifier (PPA) to transmit the required signal at the desired power level. In these architectures, the overall power consumption of the transmit chain, including all the DAC and variable gain buffer components, is at least 50 mW which is a relatively high amount of power. It is desirable to be able to reduce the power consumption of the transmit chain significantly.

All digital CMOS pre-power amplifiers exist in the art. A pre-power amplifier is designed to generate an output signal having desired waveform characteristics that is fed into the final power output stage before being transmission over the wireless channel. Previous CMOS pre-power amplifiers have typically been designed for relatively low dynamic range wireless standards such as Bluetooth and GSM/GPRS. High dynamic range wireless standards such as WCDMA or CDMA2000 require approximately 100 dB of dynamic range which represents an additional 30-40 dB over the Bluetooth and GSM/GPRS wireless standard dynamic range requirements.

There is thus a long felt need for a pre-power amplifier having high dynamic range that is able to meet the more demanding dynamic range requirements of high dynamic range wireless standards such as WCDMA and CDMA2000, for example. In addition, the pre-power amplifier should be able to be implemented using digital CMOS processes.

SUMMARY OF THE INVENTION

The present invention provides a solution to the problems of the prior art by providing a pre-power amplifier incorporating a digital attenuator circuit. The digital attenuator and associated pre-power amplifier are presented in the context of an all digital direct digital-to-RF amplitude converter (DRAC), which efficiently combines the traditional transmit chain functions of upconversion, I and Q combining, D/A conversion, filtering, buffering and RF output amplitude control into a single circuit.

The attenuator circuit functions to extend the dynamic range of the pre-power amplifier sufficient to enable implementation of more demanding wireless standards, such as WCDMA and CDMA2000, using digital CMOS processes. Use of the attenuator circuit enables the pre-power amplifier to exhibit over 100 dBm of dynamic range.

Increased dynamic range is achieved by the present invention by placing a digital current attenuator circuit at the output of the pre-power amplifier (PPA). The attenuator is placed at the output so that the minimum possible current output of the transistor switch array of the PPA can be further attenuated. The attenuator functions to split the current between the load and the power Supply $V_{DD}$ (i.e. AC ground) based on device ratio that is controlled digitally via an input power control word.

The digital attenuator is constructed as a segmented digitally controlled matrix or cell array comprising at least a pass and bypass matrix or array. Segmentation is dictated by the desire for small power control steps. The pass matrix controls the amount of current output from the PPA while the bypass matrix controls the amount of current shorted to the AC ground (i.e. power supply). By varying the number of transistors on or off in each matrix, the power output of the PPA can be easily and accurately controlled.

Several advantages of the attenuator include (1) guaranteed monotonicity, (2) power control is achieved without the need for a DAC, (3) minimum noise degradation, and (4) parasitic capacitance will not dominate the output assuming moderate attenuation of approximately 20 dB.

Note that many aspects of the invention described herein may be constructed as software objects that are executed in embedded devices as firmware, software objects that are executed as part of a software application on either an embedded or non-embedded computer system such as a digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

There is thus provided in accordance with the invention, a current attenuator for increasing the dynamic range of a signal generated by a circuit, comprising pass means for controlling the amount of current generated by the circuit that is passed through to the output of the circuit and bypass means for shorting a portion of current generated by the circuit to AC ground thereby reducing the signal output from the circuit.

There is also provided in accordance with the invention, a pre-power amplifier, comprising a load coupled to a power source, a switch array comprising a plurality of switches, the switch array for generating a current proportional to the number of switches active therein and an attenuator coupled to the load and the switch array and adapted to further attenuate the minimum current generated by the switch array.

There is further provided in accordance with the invention, a pre-power amplifier, comprising a load coupled to a power source, a switch array comprising a plurality of switches, the switch array for generating a current proportional to the number of switches active therein, an attenuator coupled to the load and the switch array comprising pass means for controlling the amount of current generated by the switch array that is passed through to the output of the pre-power amplifier and bypass means for shorting a portion of current generated by the switch array to AC ground thereby reducing signal to the output of the pre-power amplifier.

There is also provided in accordance with the invention, a pre-power amplifier, comprising a load coupled to a power source, a switch array comprising a plurality of switches, the switch array for generating a current proportional to the number of switches active therein and an attenuator for increasing the dynamic range of the switch array, the attenuator comprising a pass transistor cell array coupled in series to the load and the switch array and operative to control the amount of current generated by the switch array that is passed through to the output of the pre-power amplifier, a bypass transistor cell array coupled to the switch array and AC ground and operative to short a portion of current generated by the switch array to AC ground thereby reducing signal to the output of the pre-power amplifier.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
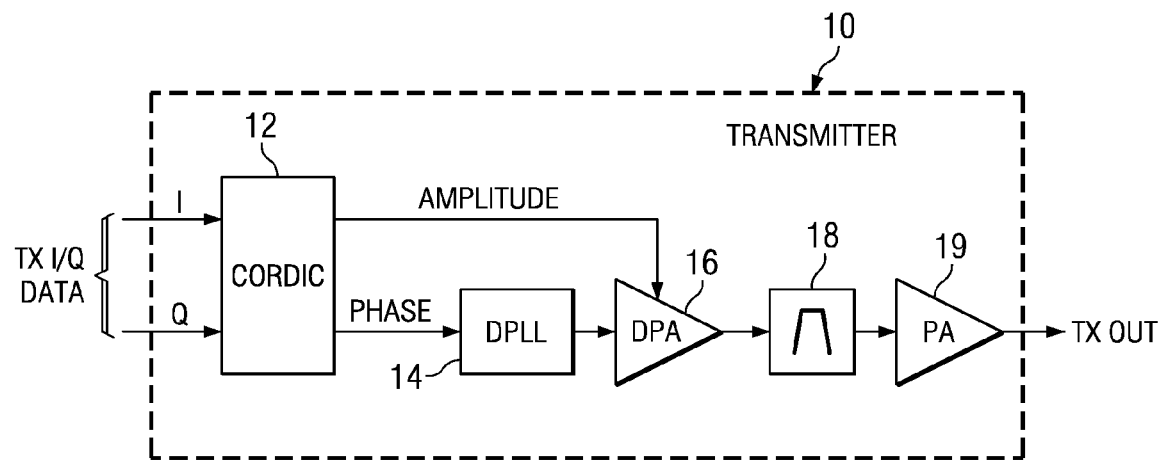
FIG. 1 is a block diagram illustrating an example embodiment of a polar transmitter and DRAC incorporating the high dynamic range pre-power amplifier of the present invention.

The following notation is used throughout this document.

| Term | Definition |
| --- | --- |
| AC | Alternating Current |
| ASIC | Application Specific Integrated Circuit |
| CDMA | Code Division Multiple Access |
| CMOS | Complementary Metal Oxide Semiconductor |
| CW | Continuous Wave |
| DAC | Digital to Analog Converter |
| DC | Direct Current |
| DCO | Digital Controlled Oscillator |
| DEM | Dynamic Element Matching |
| DPA | Digital Power Amplifier |
| DPLL | Digital Phase Locked Loop |
| DRAC | Digital to RF Amplitude Converter |
| DRP | Digital RF Processor or Digital Radio Processor |
| DSP | Digital Signal Processor |
| EDGE | Enhanced Data rates for Global Evolution |
| FPGA | Field Programmable Gate Array |
| GPRS | General Packet Radio Service |
| GSM | Global System for Mobile Communication |
| IC | Integrated Circuit |
| LSB | Least Significant Bit |
| LUT | Look Up Table |
| MSB | Most Significant Bit |
| NFET | n-channel Field Effect Transistor |
| NMOS | n-channel Metal Oxide Semiconductor |
| PA | Power Amplifier |
| PMOS | p-channel Metal Oxide Semiconductor |
| PPA | Pre-Power Amplifier |
| PVT | Process Voltage Temperature |
| RF | Radio Frequency |
| SAW | Surface Acoustic Wave |
| SNR | Signal to Noise Ratio |
| VGA | Variable Gain Amplifier |
| WCDMA | Wideband Code Division Multiple Access |

Detailed Description of the Invention

The present invention is a pre-power amplifier having high dynamic range. The pre-power amplifier is suitable for use with wireless standards such as WCDMA and CDMA2000 that demand high dynamic range transmitters. The invention is intended for use in a digital radio transmitter and receiver but can be used in other applications as well, such as a general communication channel. The present invention provides a solution to the problems of the prior art by providing an apparatus for a high dynamic range pre-power amplifier scheme for a transmitter. The dynamic range improvement circuitry is presented in the context of an all digital direct digital-to-RF amplitude converter (DRAC) or pre-power amplifier (PPA), which efficiently combines the traditional transmit chain functions of upconversion, I and Q combining, D/A conversion, filtering, buffering and RF output amplitude control into a single circuit.

To aid in understanding the principles of the present invention, the description is provided in the context of a digital to RF amplitude converter (DRAC) that serves as the final stage of an all-digital polar transmitter IC for WCDMA/CDMA2000. It is appreciated by one skilled in the art that the dynamic range improvement circuitry and pre-power amplifier of the present invention can be adapted to comply with numerous wireless communications standard such as GSM, extended data rate Bluetooth, WCDMA, CDMA2000, etc. It is appreciated, however, that the invention is not limited for use with any particular communication standard (wireless or otherwise) and may be used in optical, wired and wireless applications. Further, the invention is not limited for use with a specific modulation scheme but is applicable to other modulation schemes as well.

The term pre-power amplifier (PPA) is intended to include a transmit buffer as well as various amplifier circuits such as digital to RF amplitude converter (DRAC), digital power amplifier (DPA), transmit buffer, low power amplifier, high power amplifier, etc. and it not intended to be limited by the amount of power produced.

Note that throughout this document, the term communications device is defined as any apparatus or mechanism adapted to transmit, receive or transmit and receive data through a medium. The communications device may be adapted to communicate over any suitable medium such as RF, wireless, infrared, optical, wired, microwave, etc. In the case of wireless communications, the communications device may comprise an RF transmitter, RF receiver, RF transceiver or any combination thereof.

A block diagram illustrating an example embodiment of a polar transmitter and DRAC incorporating the high dynamic range pre-power amplifier of the present invention is shown in FIG. 1. The digital polar transmitter, generally referenced 10, comprises a cordic 12, digital phase locked loop (DPLL) 14, digital power amplifier (DPA) 16, bandpass filter 18 which may comprise a SAW filter and power amplifier 19.

In digital polar transmission, the I and Q data signals are converted by the cordic into amplitude and phase signals in the polar domain. The amplitude signal undergoes further digital processing in the digital portion (not shown) of the polar transmitter. The phase signal is input to the DPLL which incorporates a digitally controlled oscillator (DCO) for upconversion of the input phase signal. The processed amplitude signal and the phase signal output from the DPLL are both input to the DPA. The DPA functions to combine the digital amplitude and upconverted phase information into an analog transmit signal. The DPA also incorporates ΣΔ (sigma-delta) modulation to enhance the amplitude resolution and to achieve noise spectral shaping. The DRAC also performs dynamic element matching (DEM) to enhance time-averaged linearity. The SAW or other type of filter functions to suppress out of band PPA thermal and quantization noise before final amplification by the power amplifier.

Figure 2:
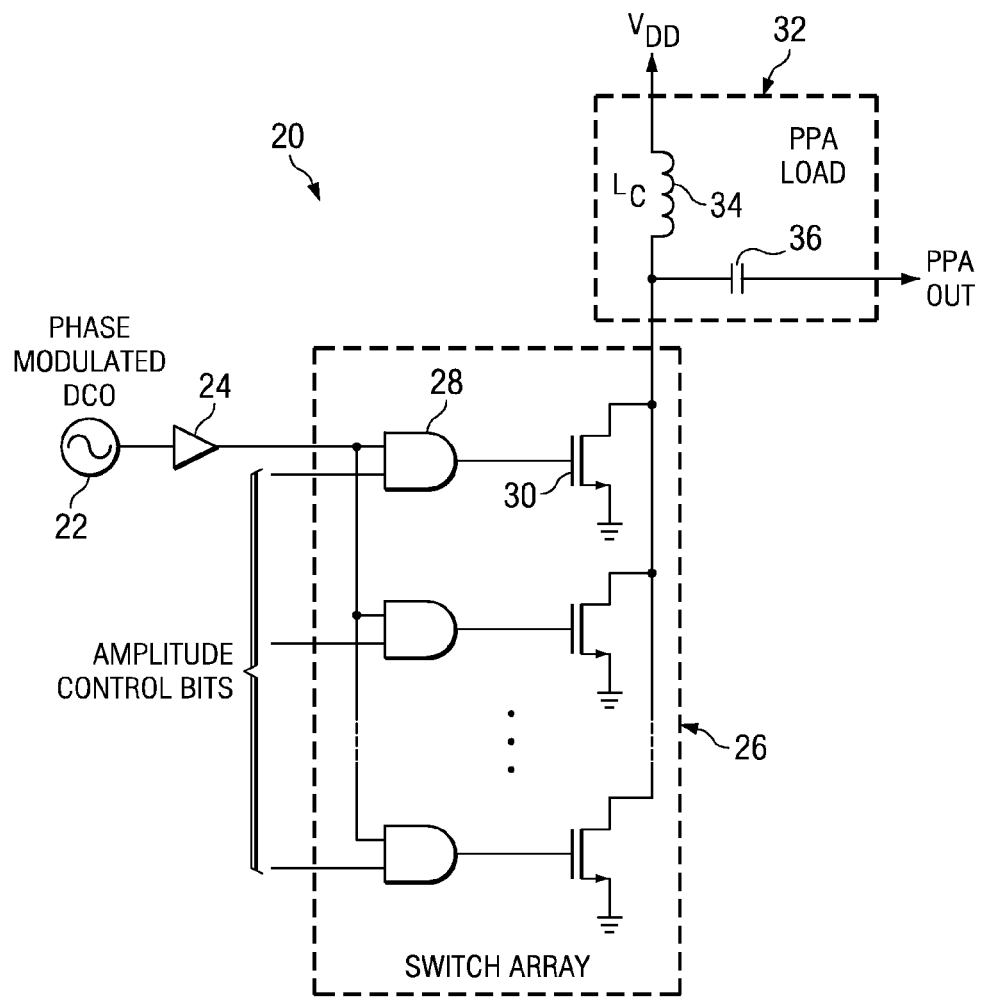
FIG. 2 is a circuit diagram illustrating a pre-power amplifier utilizing a switch array but without dynamic range improvement.

A circuit diagram illustrating a pre-power amplifier utilizing a switch array but without dynamic range improvement is shown in FIG. 2. The DRAC or pre-power amplifier (PPA), generally referenced 20, comprises a load 32 and switch array 26. The load comprises an RF choke 34 ($L_c$) and DC coupling capacitor 36. The switch array comprises a plurality of N pass-gate type AND gates 28 and a plurality of N output devices 30 (NMOS devices in this example). The PPA operates as a pseudo class E type amplifier and is driven by a transmit chain signal comprising the square wave signal output of DCO 22 and buffer 24. The PPA being a class E buffer, no DC bias current is required, unlike class A, class AB, class C or class D. The square wave signal is the phase modulated signal from the digital PLL (DPLL) 14 described supra and shown in FIG. 1. The N NMOS transistors are operative as on/off switches. An RF choke ($L_c$) functions as a bi-directional current source, connecting the NMOS switches to the on-chip supply voltage regulator ($V_{DD}$). The switch array is driven by digital amplitude control bits/word/code. The buffer draws current from an external matching network (not shown). In this manner, the buffer generates an analog voltage waveform at its output. A more detailed description of the structure and operation of the PPA 20 can be found in U.S. application Ser. No. 11/115,815, filed Apr. 26, 2005, entitled "Low Noise High Isolation Transmit Buffer Gain Control Mechanism", incorporated herein by reference in its entirety.

Figure 3:
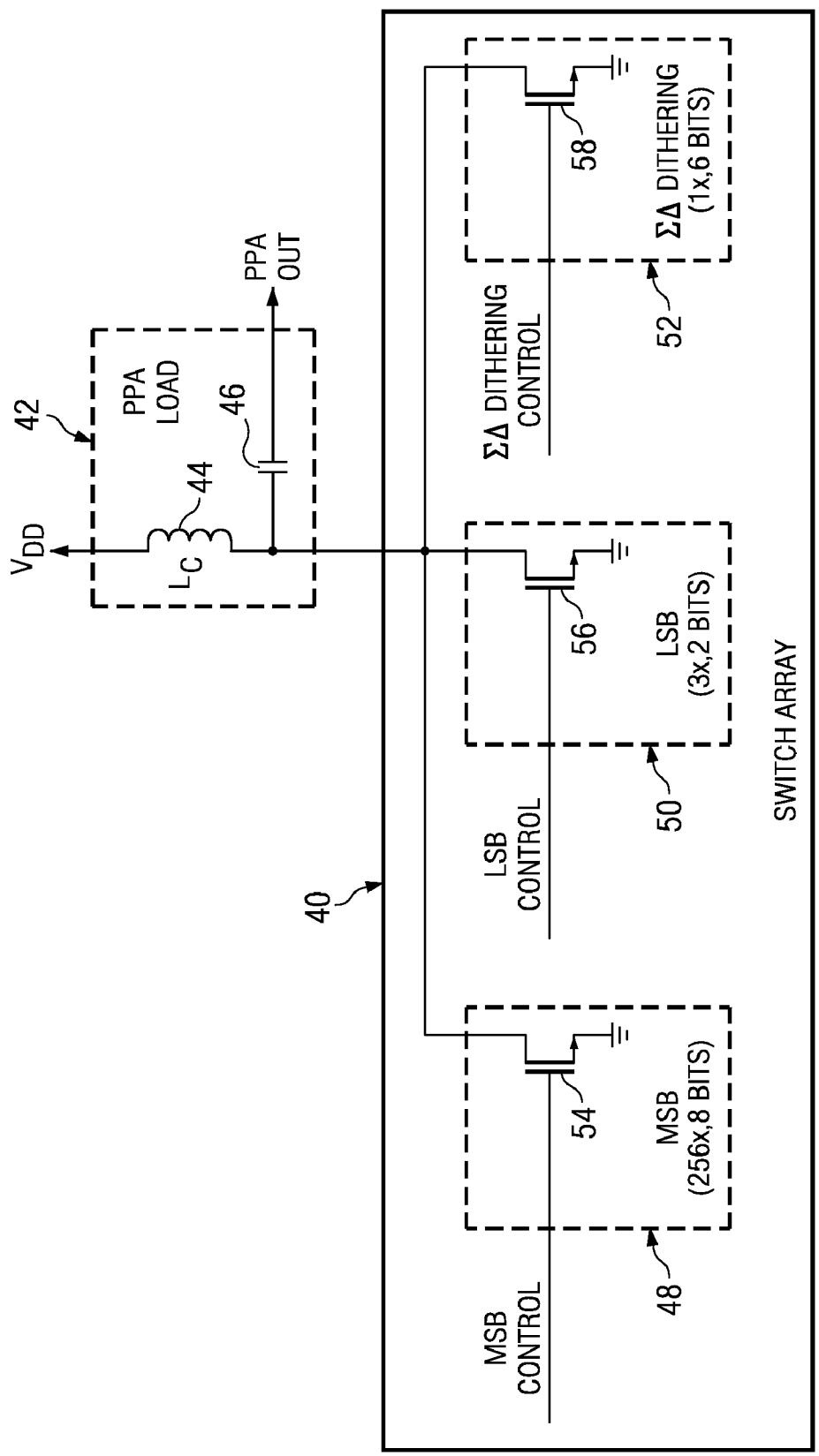
FIG. 3 is a circuit diagram illustrating an example embodiment of the switch array of FIG. 2 in more detail.

A circuit diagram illustrating an example embodiment of the switch array of FIG. 2 in more detail is shown in FIG. 3. In this example embodiment, the PPA comprises a load 42 and switch array 40. The load comprises an RF choke 44 ($L_c$) and DC coupling capacitor 46. The switch array is constructed from a plurality of transistor cell arrays or matrices. In this example, three matrices are used, namely an MSB matrix 48 comprising 256 cells 54 and 8-bit control word (only a single cell is shown for clarity), an LSB matrix 50 comprising 3 cells 56 and 2-bit control word and a sigma-delta dithering matrix 52 comprising 1 cell 58 and 1-bit control word. The transistors making up each matrix are either turned on or off in accordance with their respective control signal. The number of transistors on at any point in time within each matrix determines the amount of current contributed to the output by that matrix.

Figure 4:
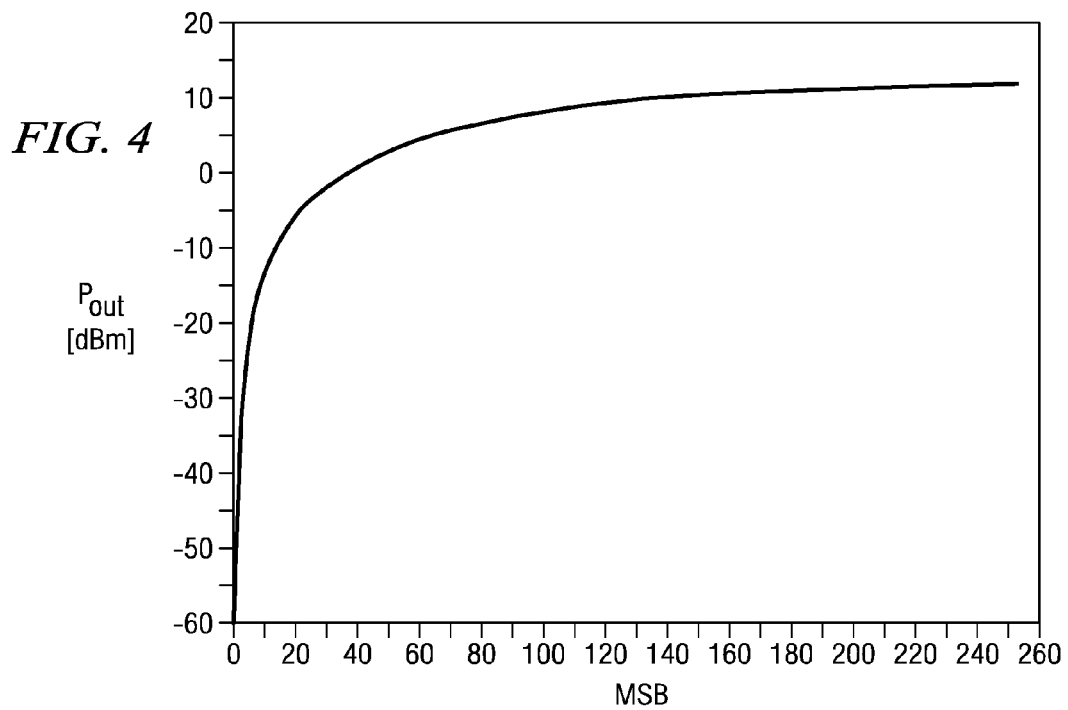
FIG. 4 is a graph illustrating the output power of the digital power amplifier without the dynamic range improvement circuitry of the present invention.

A graph illustrating the output power of the digital power amplifier without the dynamic range improvement circuitry of the present invention is shown in FIG. 4. For high dynamic range wireless standards, the power range required is approximately −90 dBm to +10 dBm (CW). The maximum output power (i.e. +10 dBm) is limited by the supply voltage. The minimum output power (−60 dBm) is limited by the amount of current output by the minimum device in the cell array. Note that the low supply voltage makes highly linear analog VGAs difficult to implement.

Pre-power amplifiers such as shown in FIGS. 2 and 3 are suitable for use with relatively low dynamic range wireless standard such as Bluetooth and GSM, GPRS. The dynamic range of these PPAs, however, is not sufficient to meet the dynamic range requirements of wireless standards such as WCDMA and CDMA2000 which require the transmitter to generate an output signal having approximately 100 dB dynamic range. The dynamic range improvement circuitry of the present invention is operative to extend the dynamic range of PPA circuits such as in FIGS. 2 and 3 such that the more demanding wireless standards, such as WCDMA and CDMA2000, can be implemented using fully digital CMOS processes.

The present invention provides a solution to this problem by providing a dynamic range improvement circuit comprising an attenuator to extend the dynamic range of the PPA. Use of the attenuator circuit of the present invention in the PPA provides sufficient improvement in dynamic range to meet the demanding requirements of high dynamic range wireless standards such as WCDMA and CDMA20000.

Figure 5:
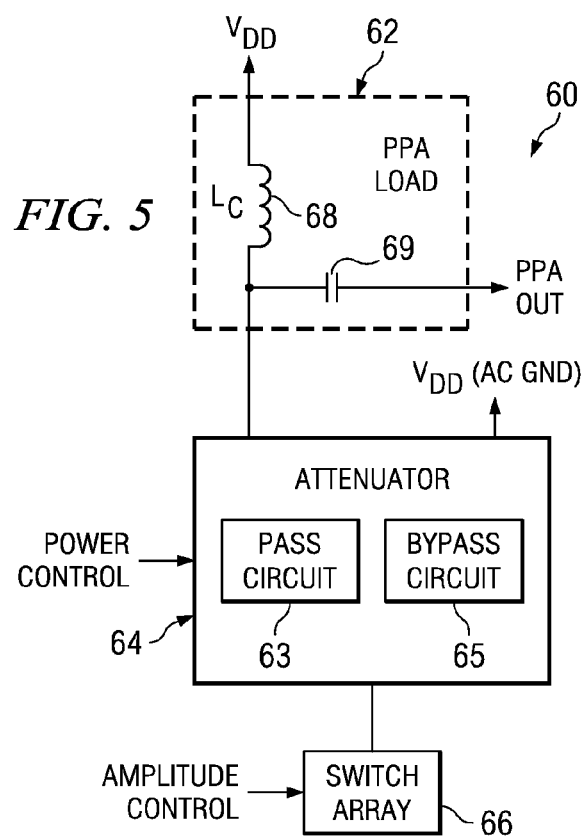
FIG. 5 is a block diagram of a pre-power amplifier incorporating the dynamic range improvement circuit of the present invention.

A block diagram of a pre-power amplifier incorporating the dynamic range improvement circuit of the present invention is shown in FIG. 5. The PPA, generally referenced 60, comprises a load 62, attenuator circuit 64 and switch array 66. The load comprises an RF choke 68 ($L_c$) and DC coupling capacitor 69. The attenuator comprises a pass circuit 63 and a bypass circuit 65. The attenuator functions to reduce the amount of current output of the PPA in a highly controlled manner. The pass and bypass circuits function to control the amount of current generated by the switch array. A power control input word determines the ratio of current flowing through the pass and bypass circuits. The operation of the pass and bypass circuits are described in more detail infra.

The switch array is made up of transistor cells having a certain minimum size. The minimum amount of current generated by the switch array on its own is too high which results in insufficient dynamic range at the PPA output. The attenuator functions to reduce this current further in accordance with the input power control word. Note that the switch matrix may comprise any suitable circuit that is capable of generating a current or voltage in proportion to an input amplitude control word.

Figure 6:
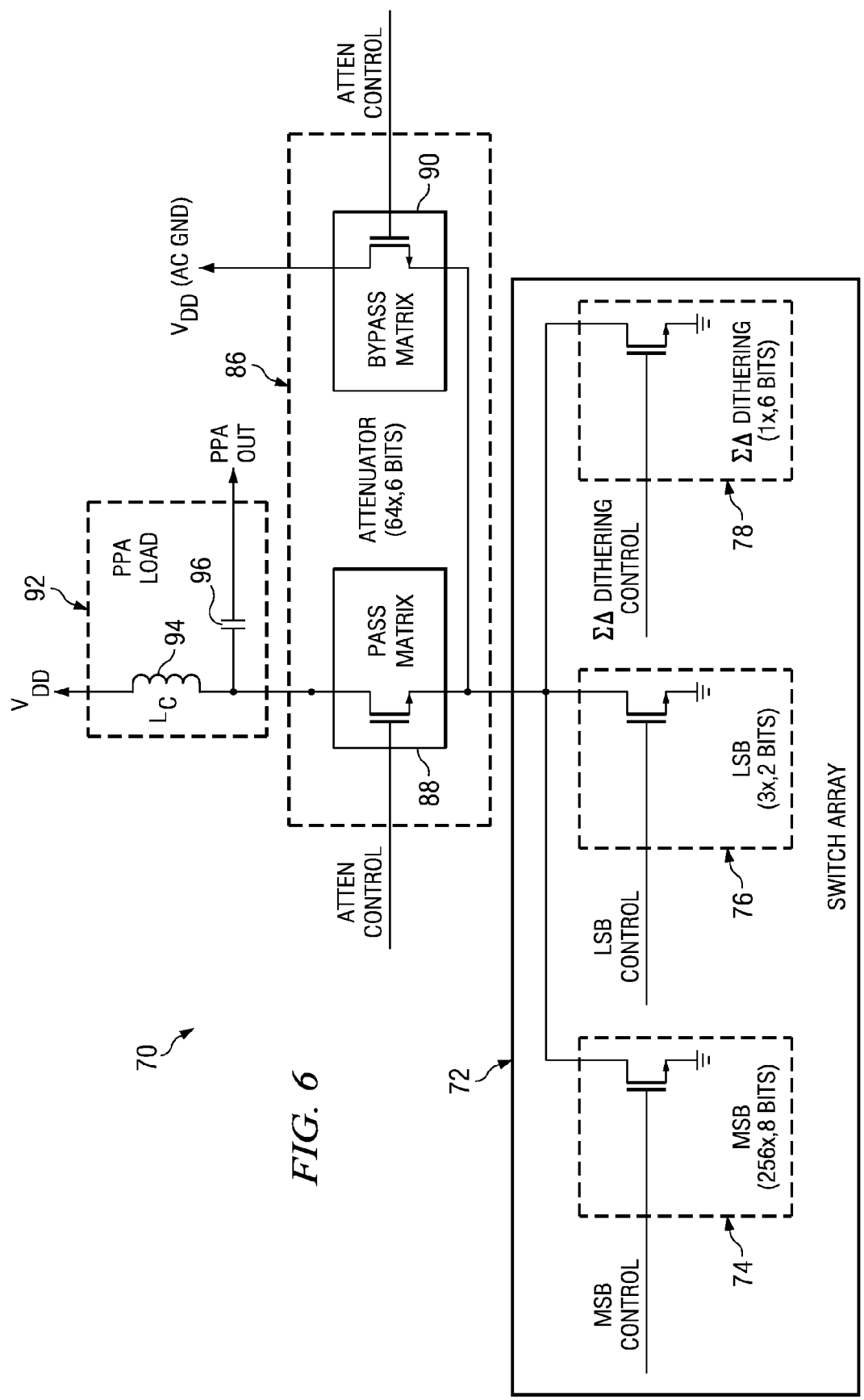
FIG. 6 is a circuit diagram illustrating an example embodiment of the prep-power amplifier incorporating the dynamic range improvement circuitry of the present invention in more detail.

A circuit diagram illustrating an example embodiment of the pre-power amplifier incorporating the dynamic range improvement circuitry of the present invention in more detail is shown in FIG. 6. The PPA, generally referenced 70, comprises a load 92, attenuator 86 and switch array 72. The load comprises an RF choke 94 ($L_c$) and DC coupling capacitor 96. The switch array 72 comprises MSB matrix 74, LSB matrix 76 and sigma-delta dithering matrix 78. The switch array 72 is constructed similarly as the switch array 40 (FIG. 3) described in detail supra. The attenuator 86 comprises a pass transistor matrix 88 and a bypass transistor matrix 90. Both matrices are controlled by an input power control word. The pass matrix is coupled in series between the output and the switch array while the bypass matrix is connected between the switch array and $V_{DD}$ (serving as AC ground).

As described above, the limiting factor for high dynamic range PPAs is the size of the minimum controllable power. A single minimum size NFET can provide approximately −40 dBm of output power which can be decreased further to −70 dBm by the use of sigma-delta dithering. High dynamic range systems, however, require a lower minimum output power of close to −90 dBm. The present invention utilizes a current attenuator at the output of the PPA such that the minimum current possible from the NFET switch matrix can be further attenuated. In operation, the attenuator splits the output current between the load and $V_{DD}$ (i.e. AC ground) based on a digitally controlled device ratio which is dictated by an input power control word and reflected in the number of transistors turned on or off in the pass and bypass matrices. This attenuation scheme enables PPAs constructed in CMOS processes to achieve a very high and well controlled dynamic range.

In the example embodiment presented herein, the digital attenuator is constructed as a segmented digitally controlled matrix or cell array comprising at least a pass and bypass array. Segmentation is dictated by the desire for small power control steps. Advantages of the attenuator include (1) guaranteed monotonicity, (2) power control is achieved without the need for a DAC, (3) minimum noise degradation, and (4) parasitic capacitance will not dominate the output assuming moderate attenuation of approximately 20 dB.

Figure 7:
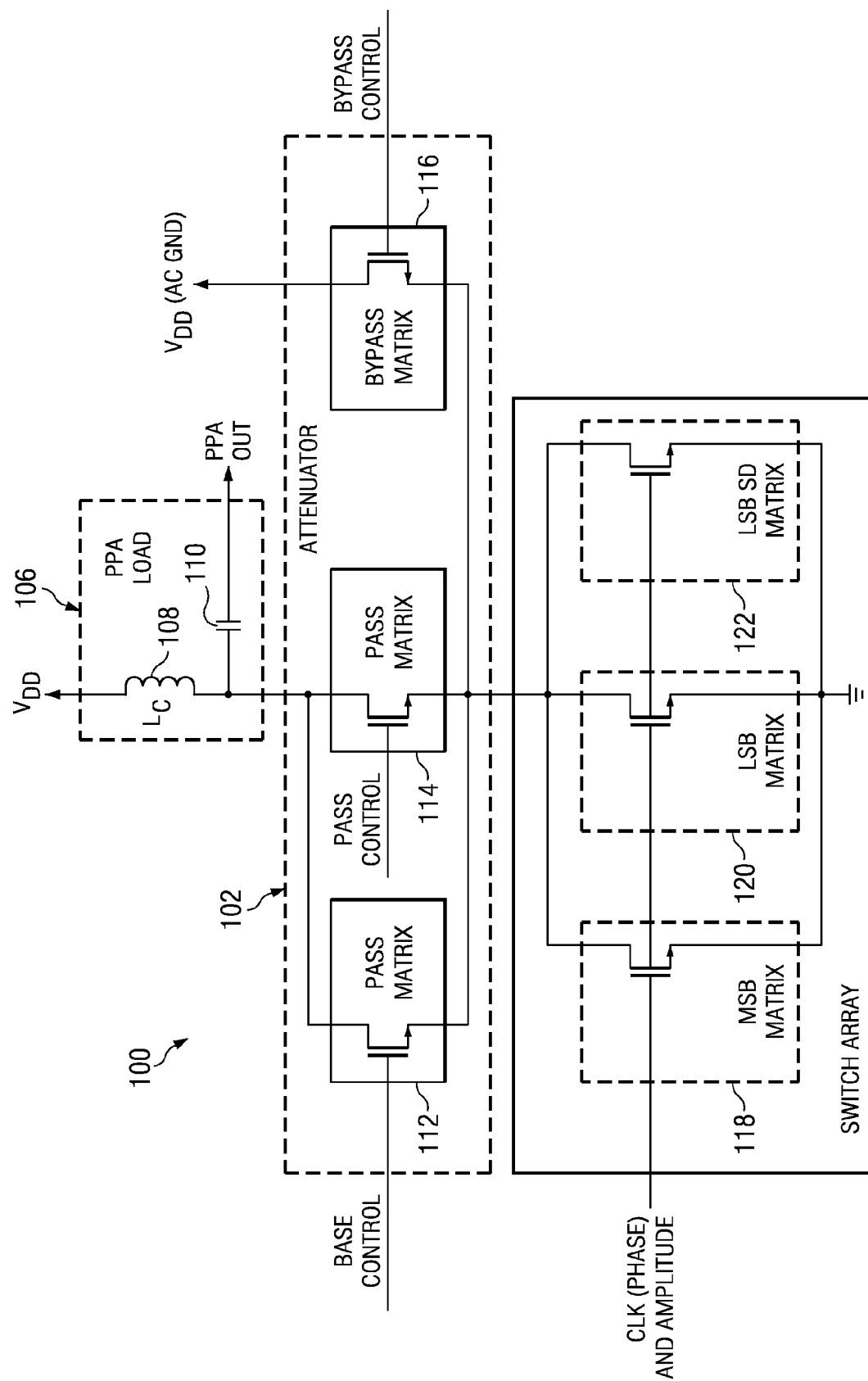
FIG. 7 is a circuit diagram illustrating an example embodiment of the attenuator and switch array portions of the pre-power amplifier in more detail.

A circuit diagram illustrating an example embodiment of the attenuator and switch array portions of the pre-power amplifier in more detail is shown in FIG. 7. The PPA, generally referenced 100, comprises a load 106, attenuator 102 and switch array 104. The load comprises an RF choke 108 ($L_c$) and DC coupling capacitor 110. The switch array 104 comprises an MSB matrix 118, LSB matrix 120 and sigma-delta dithering matrix 122. The switch array 104 is constructed similarly as the switch array 40 (FIG. 3) described in detail supra.

The attenuator 102 comprises a pass matrix 114 and bypass matrix 116. In this embodiment, a third base matrix 112 is used as well. The base matrix is connected in parallel with the pass matrix. During normal operation, all the cell or transistor elements of the base matrix are on. Use of the base matrix creates a sufficient signal path thus making reasonable power steps possible. By reducing the number of active base transistor elements, the attenuator step size can be increased. At the same time, however, the total dynamic range increases until physical limits are ultimately reached. If the dynamic range becomes too high, parasitic capacitance begins to limit the output and further improvements in dynamic range are ineffective.

As described supra, the pass matrix controls the amount of current passing through to the output and the bypass matrix controls how much current is shorted to the power supply (i.e. AC ground). Both matrices function in combination provide power control of the PPA output. Minimum power output is achieved with maximum attenuation which is realized when all pass matrix transistors are off (minimum current to the output) and all bypass matrix transistors are on (maximum shorting current). Maximum power output is achieved with minimum attenuation which is realized when all pass matrix transistors are on (maximum current to the output) and all bypass matrix transistors are off (minimum shorting current). Output power is controlled between the minimum and maximum by turning on the transistors in the pass and bypass matrices in different ratios in accordance with the desired output power.

To aid in understanding the operation of the invention, the attenuator circuit is divided into two phases of operation. Phase 1 is operative from minimum output power to half power and phase 2 is operative from half power to maximum output power. Phase 1 operation is described below followed by a description of phase 2 operation.

Figure 8:
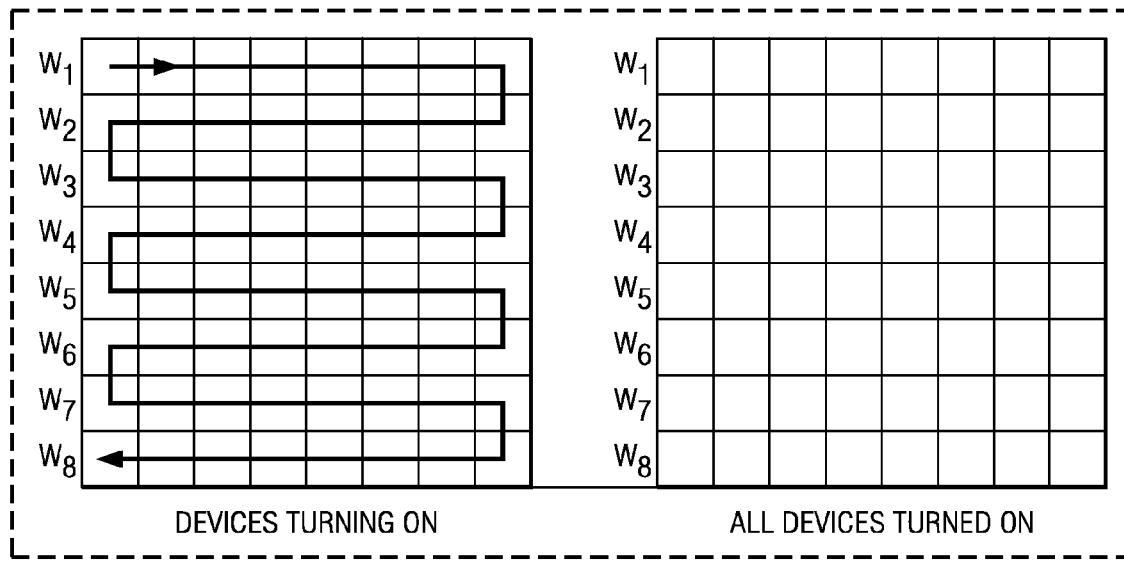
FIG. 8 is a diagram illustrating the transistor turn on path of the pass and bypass matrices in phase 1 operation of the attenuator.

A diagram illustrating the transistor turn on path of the pass and bypass matrices in phase 1 operation of the attenuator is shown in FIG. 8. The pass matrix comprises a segmented transistor cell array. The transistor characteristics of the columns of the matrix within a row are the same. The rows, however, are different. In this example embodiment, the 8×8 matrix is designed for 0.2 dB power steps forcing each row to have a unique transistor width. If unit size transistors were used for the entire matrix, the base matrix would need to be significantly larger making any dynamic range improvements ineffective.

The uniqueness of each row requires the rows to be turned on in a particular order. At the lowest possible output power the entire pass matrix is turned off and the bypass matrix is turned on. As the output power is increased, the smallest transistors are turned on in accordance with their size starting with the smallest cell. When the entire matrix is turned on, the attenuator is at half (i.e. middle) attenuation of about 10 dB.

Several techniques can be used to improve dynamic element matching (DEM) from one attenuator step to the next. Dynamic element matching functions to reduce device mismatch between adjacent codes whereby switching between adjacent transistors is performed in the actual implementation. By way of example only, considering the matrix, increasing output power values translate to additional transistors being turned on. To compensate for mismatches between transistors due to process, voltage and temperature (PVT), as the end of a row is reached, the path continues with the next row but in the opposite direction. Rather than returning to the beginning of the next row when the end of a row is reached, the next row below is traversed in the opposite direction. This results in the snake like path shown in FIGS. 8 and 9.

Further, dummy cells are placed before the beginning and after the end of each row resulting in two extra columns of transistors. Each row has its own dummy unit cell terminations which aid in reducing mismatches between devices.

The bypass matrix is constructed and operates similarly as the pass matrix. One difference is that as power is increased up to the middle point (i.e. phase 1 operation), the bypass matrix elements are all on. At mid attenuation, both pass and bypass matrices are fully on. As the power is increased further, the pass matrix remains fully on but the bypass matrix elements are turned off beginning with the largest elements. In operation, the operation of the bypass matrix is in reverse order to that of the pass matrix.

Figure 10:
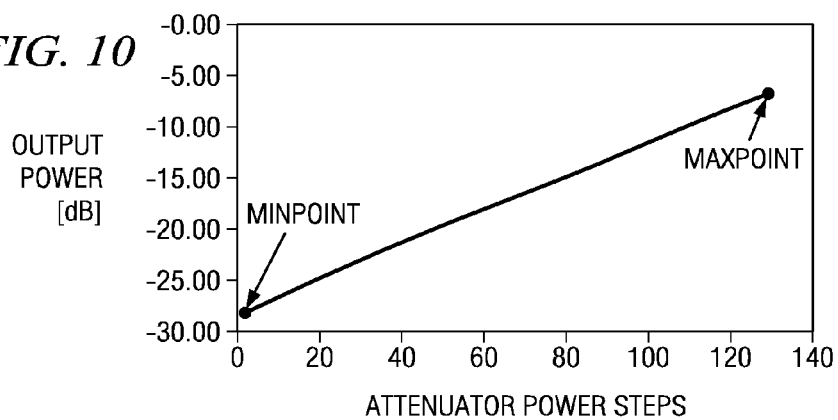
FIG. 10 is a graph illustrating the digital power amplifier output power control with the attenuator circuit of the present invention as a function of attenuator steps.
Figure 11:
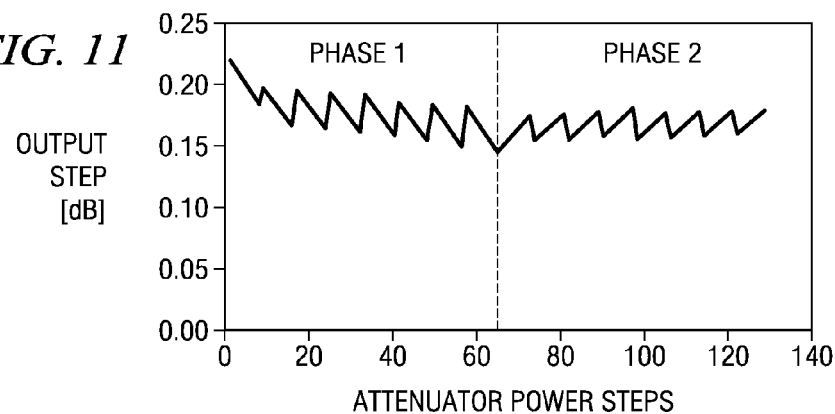
FIG. 11 is a graph illustrating the attenuator power step as a function of attenuator steps.

The total power control range of the attenuator is shown in FIG. 10. The attenuation power step size in dB is shown as a function of attenuator step code is shown in FIG. 11. Note that in this example both pass and bypass matrices are 8×8 resulting in 8×8+8×8=128 total attenuator power steps available.

Figure 9:
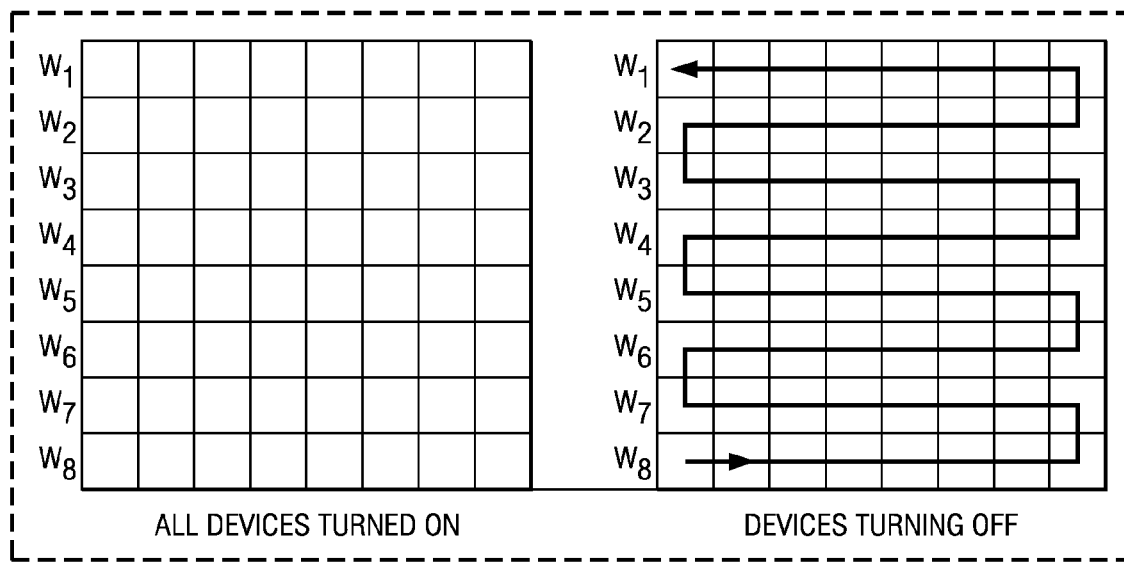
FIG. 9 is a diagram illustrating the transistor turn off path of the pass and bypass matrices in phase 2 operation of the attenuator.

A diagram illustrating the transistor turn off path of the pass and bypass matrices in phase 2 operation of the attenuator is shown in FIG. 9. Phase 2 operation covers attenuation levels from middle attenuation to minimum attenuation, i.e. from half power to maximum power. At mid-power, both matrices are fully on. As power is increased, elements in the bypass matrix begin turning off thus reducing the amount of current shorted to AC ground. The largest elements which are located in the bottom row of the matrix are turned off first. The path traverses from the bottom to the top of the matrix until all elements are turned off.

Figure 12:
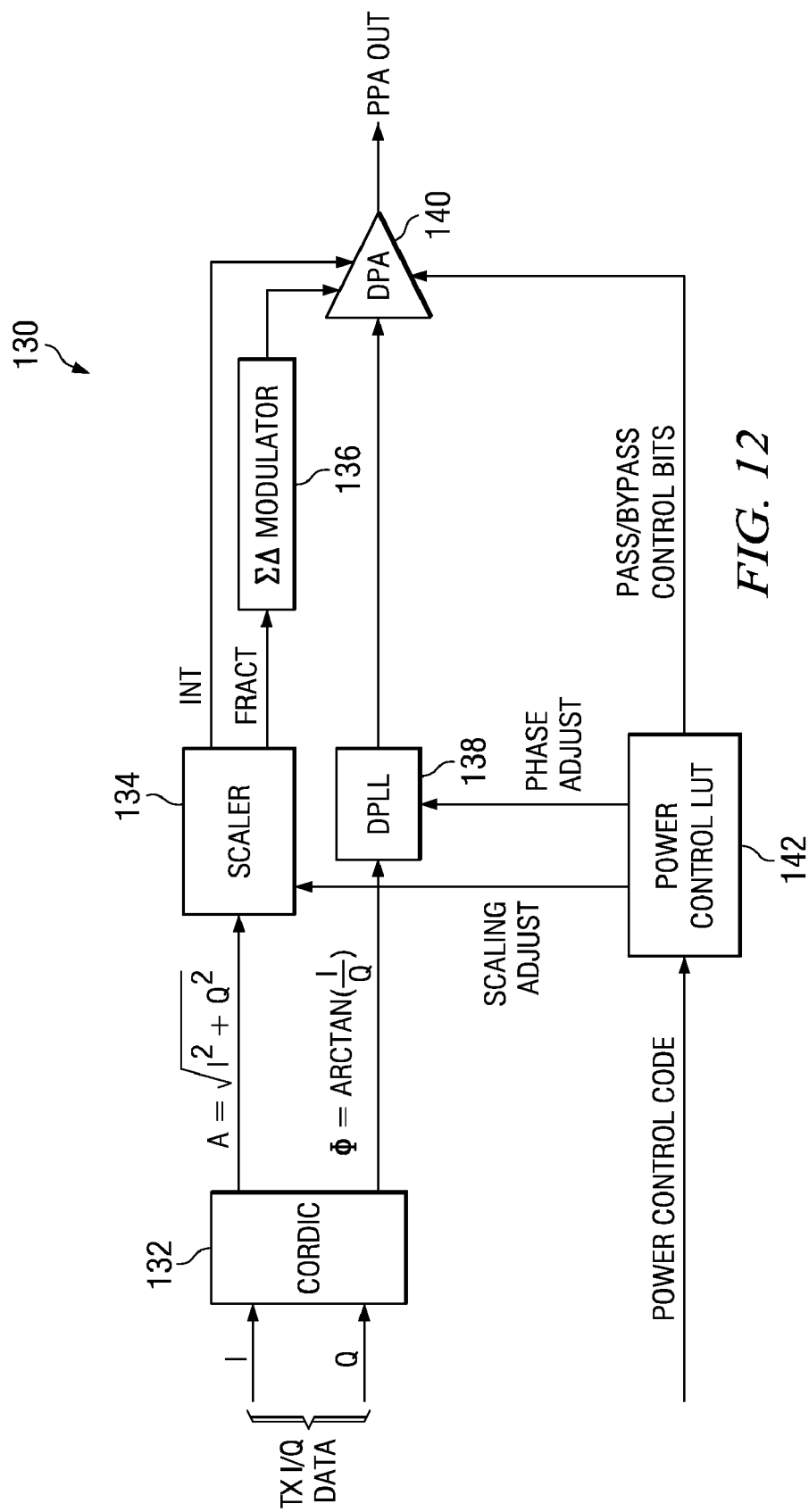
FIG. 12 is a block diagram illustrating an example embodiment of a polar transmitter and DRAC incorporating the high dynamic range digital pre-power amplifier with power control lookup table of the present invention.

A block diagram illustrating an example embodiment of a polar transmitter and DRAC incorporating the high dynamic range digital pre-power amplifier with power control lookup table of the present invention is shown in FIG. 12. The digital polar transmitter, generally referenced 130, comprises a cordic 132, scaler 134, sigma-delta modulator 136, digital phase locked loop (DPLL) 138, digital power amplifier (DPA) 140 and power control circuit 142.

For polar transmission, the I and Q data signals are converted by the cordic into amplitude and phase signals in the polar domain. The amplitude signal undergoes scaling and is split into an integer portion and a fractional portion. The integer portion is input to the DPA and the fractional portion is input to the ΣΔ (sigma-delta) modulator. Sigma-delta modulation is used to enhance the amplitude resolution and to achieve noise spectral shaping. The phase signal is input to the DPLL which incorporates a digitally controlled oscillator (DCO) for upconversion of the input phase signal. The processed amplitude signal and the phase signal output from the DPLL are both input to the DPA. The DPA, incorporating the attenuation circuit of the present invention, functions to combine the integer portion of the digital amplitude, upconverted phase information and output of the sigma-delta modulator into an analog transmit signal.

The power control uses a look up table (LUT) to provide control over the output power generated by the DPA. A power control code determines the amount of output power to be generated. Based on the power control code, the pass and bypass matrices are configured to achieve the desired output power dynamic range. The power control unit 142 provides a scaling adjustment signal that is used by the scaler, a phase adjustment signal used by the DPLL and the pass and bypass matrix control bits that determine the number of elements on or off in each matrix.

Figure 13:
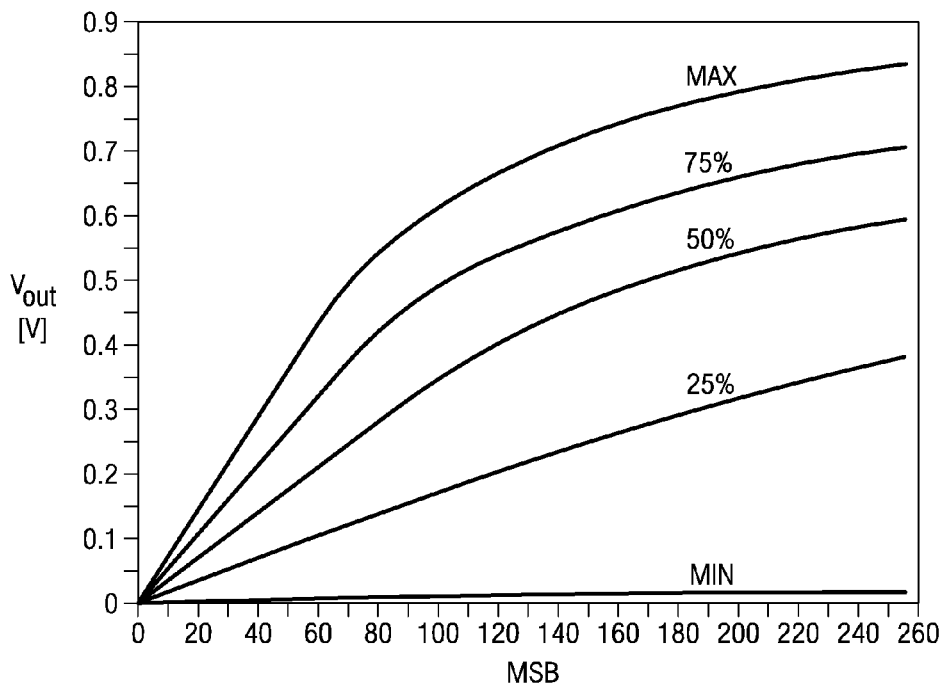
FIG. 13 is a graph illustrating the digital pre-power amplifier output at different attenuations.

A graph illustrating the digital pre-power amplifier output at different attenuations is shown in FIG. 13. Several curves of the output voltage from the PPA as a function of MSB at various attenuator settings are shown. The minimum output voltage is realized at maximum attenuation whereby the pass matrix has one element turned on and the bypass matrix is fully on. Output of 25% is realized with 16 elements in the pass matrix on and 48 elements in the bypass matrix on. Output of 50% is realized with 32 elements in the pass matrix on and 32 elements in the bypass matrix on. Output of 75% is realized with 48 elements in the pass matrix on and 16 elements in the bypass matrix on. Maximum output (minimum attenuation) is realized with the pass matrix fully on and the bypass matrix fully off.

Figure 14:
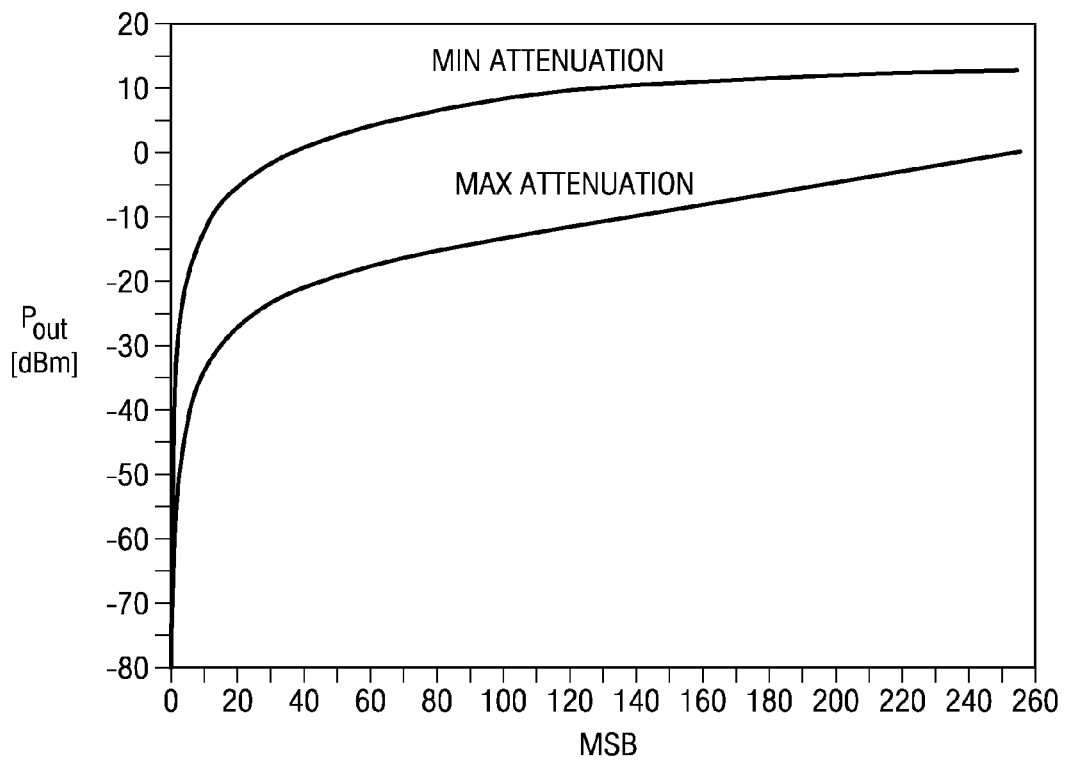
FIG. 14 is a graph illustrating the dynamic range of the digital pre-power amplifier output at minimum and maximum attenuation.

A graph illustrating the dynamic range of the digital pre-power amplifier output at minimum and maximum attenuation is shown in FIG. 14. Maximum attenuation results in a minimum power output of almost −76 dBm at an MSB of 0 and a maximum power of +0.19 dBm at an MSB of 256. Minimum attenuation yields a minimum power of −57.4 dBm at an MSB of 0 and a maximum power of +12.6 dBm at an MSB of 256. Note that an additional +18 dB of dynamic range is achieved through the use of dithering thus realizing over 100 dB of dynamic range.

Figure 15:
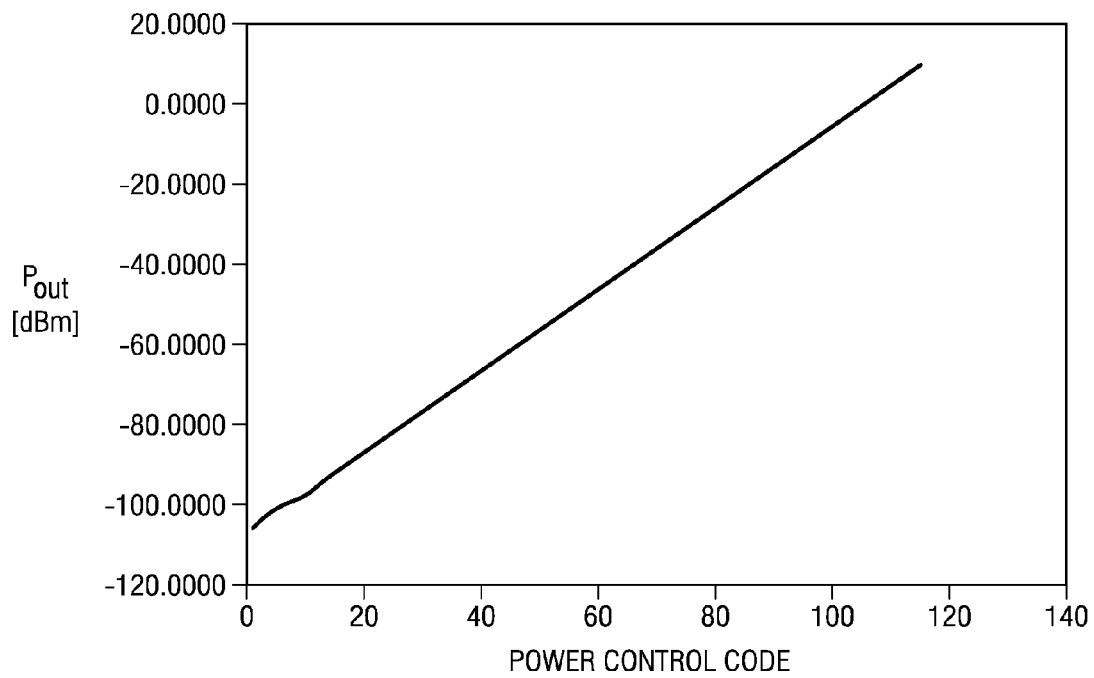
FIG. 15 is a graph illustrating the pre-power amplifier output power as a function of the power control code.

A graph illustrating the pre-power amplifier output power as a function of the power control code is shown in FIG. 15. As described supra, key benefits of the attenuator scheme of the present invention are high dynamic range and easily controllable output power as shown in the Figure. The maximum output power is the same as with the PPA without the attenuation circuit. The PPA incorporating the attenuation circuit of the present invention, however, is able to reduce the output power to less then −100 dBm which is close to substrate and package leakage levels.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A pre-power amplifier comprising:
   A. a load having a load input, a first alternating current ground connection, and a load output, the load including an RF choke connected in series between the load input and the alternating current ground connection, and a DC coupling capacitor having one lead connected to the load input and another lead connected to the load output;
   B. a switch array having digital inputs and an array output, the switch array including a most significant bit array of CMOS transistors, a least significant bit array of CMOS transistors, and a sigma-delta least significant bit array of CMOS transistors, each transistor having a lead connected to the array output, a lead connected to circuit ground, and an input coupled to the digital inputs; and
   C. an attenuator having digital pass inputs, digital bypass inputs, an attenuator input connected to the array output, an attenuator output connected to the load input, and a second alternating current ground connection, the attenuator including a pass matrix of CMOS transistors and a bypass matrix of CMOS transistors, each transistor in the pass matrix having a lead connected to the attenuator output, a lead connected to the attenuator input, and a lead coupled to the digital pass inputs, each transistor in the bypass matrix having a lead connected to the attenuator input, a lead connected to the second alternating current ground connection, and a lead coupled to the digital bypass inputs.

2. The amplifier of claim 1 in which the attenuator includes digital bass inputs and a bass matrix of CMOS transistors separate from the pass matrix, each transistor in the bass matrix having a lead connected to the attenuator output, a lead connected to the attenuator input, and a lead coupled to the digital bass inputs.

3. The amplifier of claim 1 in which the transistors of the pass matrix and the bypass matrix are arranged in rows and columns and the characteristics of the transistors in each row are different.

4. The amplifier of claim 1 in which the transistors of the pass matrix and the bypass matrix are arranged in eight rows and eight columns and the characteristics of the transistors in each row are different.

* * * * *